(12) United States Patent
Jang

(10) Patent No.: US 6,180,540 B1
(45) Date of Patent: Jan. 30, 2001

(54) METHOD FOR FORMING A STABILIZED FLUOROSILICATE GLASS LAYER

(75) Inventor: Syun-Ming Jang, Hsin-chu (TW)

(73) Assignee: Taiwan Semiconductor Manufacturing Company, Hsin-Chu (TW)

(*) Notice: Under 35 U.S.C. 154(b), the term of this patent shall be extended for 0 days.

(21) Appl. No.: 09/252,866

(22) Filed: Feb. 18, 1999

(51) Int. Cl.$^7$ .................. H01L 21/31; H01L 21/469
(52) U.S. Cl. .................. 438/784; 438/788; 438/692; 438/778; 438/783; 438/710
(58) Field of Search .................... 438/624, 692, 438/784, 788, 710, 778, 783

(56) References Cited

U.S. PATENT DOCUMENTS

| | | | |
|---|---|---|---|
| 5,759,906 | 6/1998 | Lou | 438/623 |
| 5,763,010 | 6/1998 | Guo et al. | 427/376.2 |
| 5,811,356 | 9/1998 | Murugesh et al. | 438/711 |
| 5,827,785 | 10/1998 | Bhan et al. | 438/784 |
| 5,908,672 * | 6/1999 | Ryu et al. | |
| 5,937,323 * | 8/1999 | Orczyk et al. | |
| 5,990,000 * | 11/1999 | Hong et al. | |
| 6,034,418 * | 3/2000 | Matsuura | |
| 6,077,784 * | 6/2000 | Wu et al. | |
| 6,103,601 * | 8/2000 | Lee et al. | |

* cited by examiner

Primary Examiner—Charles Bowers
Assistant Examiner—Stephen W. Smoot
(74) Attorney, Agent, or Firm—George O. Saile; Stephen B. Ackerman; Stephen G. Stanton

(57) ABSTRACT

A method for forming a fluorosilicate glass (FSG) layer. There is first provided a substrate. There is then formed over the substrate a fluorosilicate glass (FSG) layer. Finally, there is then removed, while employing a plasma etch method, a surface layer of the fluorosilicate glass (FSG) layer to form an etched fluorosilicate glass (FSG) layer. Within the method, the surface layer of the fluorosilicate glass (FSG) layer has a higher moisture content than the remaining etched fluorosilicate glass (FSG) layer. The method is particularly applicable for removing hydrated surface layers of chemical mechanical polish (CMP) planarized fluorosilicate glass (FSG) layers to provide non-hydrated underlying remainder layers of chemical mechanical polish (CMP) planarized fluorosilicate glass (FSG) layers which are stabilized with respect to hydrolysis involving loosely bound mobile fluorine atoms.

15 Claims, 2 Drawing Sheets

METHOD FOR FORMING A STABILIZED FLUOROSILICATE GLASS LAYER

BACKGROUND OF THE INVENTION

1. Field of the Invention

The present invention relates generally to forming fluorosilicate glass (FSG) layers within microelectronics fabrications. More particularly, the present invention relates to methods for forming stabilized fluorosilicate glass (FSG) layers within microelectronics fabrications.

2. Description of the Related Art

Microelectronic fabrications are formed from microelectronic substrates over which are formed patterned microelectronic conductor layers which are separated by microelectronic dielectric layers. As microelectronic fabrication integration levels have increased and microelectronic device and patterned microelectronic conductor layer dimensions have decreased, it has become increasingly more important within the art of microelectronic fabrication to form interposed between the patterns of patterned microelectronic conductor layers within microelectronic fabrications microelectronic dielectric layers formed of low dielectric constant dielectric materials. Low dielectric constant dielectric materials are desirable for forming microelectronic dielectric layers formed interposed between the patterns of patterned microelectronic conductor layers within microelectronic fabrications since such low dielectric constant dielectric materials provide, among other features, microelectronic fabrications with enhanced microelectronic fabrication speed and reduced patterned microelectronic conductor layer cross-talk.

For the purposes of the present disclosure, low dielectric constant dielectric materials are intended as dielectric materials having a dielectric constant (relative to vacuum) of preferably less than about 3.7, and more preferably from about 2.5 to about 3.5. For comparison purposes, conventional dielectric materials which are typically employed within microelectronic fabrications, such conventional dielectric materials including but not limited to silicon oxide dielectric materials, silicon nitride dielectric materials and silicon oxynitride dielectric materials, typically have dielectric constants in the range of from about 4.0 to about 9.0.

Of the low dielectric constant dielectric materials which may be employed for forming low dielectric constant dielectric layers within microelectronic fabrications fluorosilicate glass (FSG) low dielectric constant dielectric materials have recently received considerable interest and attention. Within the context of the present application, fluorosilicate glass (FSG) low dielectric constant dielectric materials are intended as non-stoichiometric silicon oxide dielectric materials which have incorporated therein a fluorine dopant at a concentration of from about 4 to about 7 atom percent. Such fluorosilicate glass (FSG) low dielectric constant dielectric materials typically have a dielectric constant of from about 3.5 to about 3.8. Fluorosilicate glass (FSG) low dielectric constant dielectric materials are generally of interest insofar as they may under certain circumstances be formed by employing comparatively minor modifications of methods which are conventionally employed for forming silicon oxide dielectric materials within microelectronic fabrications.

While low dielectric constant dielectric layers formed of fluorosilicate glass (FSG) dielectric materials are thus desirable within the art of microelectronic fabrication, low dielectric constant dielectric layers formed of fluorosilicate glass (FSG) dielectric materials are nonetheless not entirely without problems within the art of microelectronic fabrication. In particular, it is known in the art of microelectronic fabrication that low dielectric constant dielectric layers formed of fluorosilicate glass (FSG) dielectric materials are often chemically unstable incident to the incorporation therein of loosely bound mobile fluorine atoms. The loosely bound mobile fluorine atoms thus typically encountered within fluorosilicate glass (FSG) low dielectric constant dielectric materials are generally also susceptible to reaction with or transfer through various microelectronic layers typically employed within a microelectronic fabrication within which is formed a low dielectric constant dielectric layer formed of a fluorosilicate glass (FSG) low dielectric constant dielectric material to thus provide compromised operation of the microelectronic fabrication within which is formed such a low dielectric constant dielectric layer formed of a fluorosilicate glass (FSG) dielectric material.

It is thus towards the goal of forming within a microelectronics fabrication a low dielectric constant dielectric layer formed of a fluorosilicate glass (FSG) dielectric material with enhanced stability with respect to loosely bound mobile fluorine atoms that the present invention is more particularly directed.

Various methods have been disclosed within the art of microelectronic fabrication for forming dielectric layers with desirable properties within microelectronic fabrications.

For example, Lou, in U.S. Pat. No. 5,759,906, discloses a method for forming within a microelectronic fabrication a planarized inter-metal dielectric (IMD) layer comprising a low dielectric constant dielectric material comprising a spin-on-glass (SOG) dielectric material or a spin-on-polymer (SOP) dielectric material: (1) without directly planarizing the low dielectric constant dielectric material; and (2) while not exposing within a via formed through planarized inter-metal dielectric (IMD) layer the low dielectric constant dielectric material comprising the spin-on-glass (SOG) dielectric material or the spin-on-polymer (SOP) dielectric material. To realize the foregoing objects, there is first employed when forming the planarized inter-metal dielectric (IMD) layer a dielectric capping layer (which may be formed of a fluorosilicate glass (FSG) dielectric material) where the dielectric capping layer is partially chemical mechanical polish (CMP) planarized without planarizing the low dielectric constant dielectric material comprising the spin-on-glass (SOG) dielectric material or the spin-on-polymer (SOP) dielectric material. There is then also formed an annular dielectric spacer layer (which may also be formed of a fluorosilicate glass (FSG) dielectric material) into a via formed through the partially chemical mechanical polish (CMP) planarized dielectric capping layer and the underlying low dielectric constant dielectric material.

In addition, Guo et al., in U.S. Pat. No. 5,763,010, disclose a method for stabilizing a halogen doped silicon oxide layer, such as a fluorosilicate glass (FSG) layer, with respect to loosely bound migrating halogen atoms within the halogen doped silicon oxide layer. The method employs, prior to forming a diffusion barrier layer upon the halogen doped silicon oxide layer, a thermal annealing and degassing of the halogen doped silicon oxide layer at a temperature of from about 300 to about 550 degrees centigrade, and under the circumstances where the halogen doped silicon oxide layer is formed of a fluorosilicate glass (FSG) material, for a time period of from about 35 to about 50 seconds.

Further, Murugesh et al., in U.S. Pat. No. 5,811,356, discloses a method for reducing mobile ionic and metallic contaminants within a microelectronics layer, such as a microelectronics dielectric layer, formed within a microelectronics reactor chamber. The method employs seasoning the microelectronics reactor chamber by depositing a layer of an encapsulant material within the microelectronics reactor chamber at a bias radio frequency power density of greater than about 0.051 watts per square centimeter for a time period of greater than about 30 seconds.

Finally, Bhan et al., in U.S. Pat. No. 5,827,785, also discloses a method for forming within a microelectronics fabrication a halogen doped silicon oxide layer, such as a fluorosilicate glass (FSG) layer, with improved stability with respect to loosely bound mobile halogen atoms within the halogen doped silicon oxide layer. To realize that object, there is employed when forming the halogen doped silicon oxide layer a silicon source material, an oxygen source material, a first halogen source material and a second halogen source material different from the first halogen source material.

Desirable in the art of microelectronic fabrication are additional methods and materials which may be employed for forming fluorosilicate glass (FSG) layers with enhanced stability with respect to loosely bound mobile fluorine atoms within the fluorosilicate glass (FSG) layers.

It is towards that goal that the present invention is directed.

SUMMARY OF THE INVENTION

A first object of the present invention is to provide a method for forming a fluorosilicate glass (FSG) layer within a microelectronic fabrication.

A second object of the present invention is to provide a method in accord with the first object of the present invention, where the fluorosilicate glass (FSG) layer is formed with enhanced stability with respect to loosely bound mobile fluorine atoms within the fluorosilicate glass (FSG) layer.

A third object of the present invention is to provide a method in accord with the first object of the present invention or the second object of the present invention, which method is readily commercially implemented.

In accord with the objects of the present invention, there is provided by the present invention a method for forming a fluorosilicate glass (FSG) layer within a microelectronics fabrication. To practice the method of the present invention, there is first provided a substrate employed within a microelectronics fabrication. There is then formed over the substrate a fluorosilicate glass (FSG) layer. Finally, there is then removed, while employing a plasma etch method, a surface layer of the fluorosilicate glass (FSG) layer to form an etched fluorosilicate glass (FSG) layer. Within the method of the present invention the surface layer of the fluorosilicate glass (FSG) layer which is removed has a higher moisture content than the etched fluorosilicate glass (FSG) layer which remains.

There is provided by the present invention a method for forming a fluorosilicate glass (FSG) layer within a microelectronic fabrication, where the fluorosilicate glass (FSG) layer is formed with enhanced stability with respect to loosely bound mobile fluorine atoms within the fluorosilicate glass (FSG) layer. The method of the present invention realizes the foregoing objects by employing when forming the fluorosilicate glass (FSG) layer a plasma etch method for removing a surface layer of a fluorosilicate glass (FSG) layer to provide an etched fluorosilicate glass (FSG) layer, where the surface layer of the fluorosilicate (FSG) layer which is removed has a higher moisture content than the remaining etched fluorosilicate glass (FSG) layer. By removing the surface layer of the fluorosilicate glass (FSG) layer which has the higher moisture content than the remaining etched fluorosilicate glass (FSG) layer, there is removed from the fluorosilicate glass (FSG) layer moisture which would otherwise be available to react with loosely bound mobile fluorine atoms within the fluorosilicate glass (FSG) layer.

The method of the present invention is readily commercially implemented. The present invention employs methods and materials as are generally known in the art of microelectronic fabrication. Since it is a process control along with methods and materials selection which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming a fluorosilicate glass (FSG) layer within a microelectronic fabrication, where the fluorosilicate glass (FSG) layer is formed with enhanced stability with respect to loosely bound mobile fluorine atoms within the fluorosilicate glass (FSG) layer. The method of the present invention realizes the foregoing objects by employing when forming the fluorosilicate glass (FSG) layer a plasma etch method for removing a surface layer of the fluorosilicate glass (FSG) layer to provide an etched fluorosilicate glass (FSG) layer, where the surface layer of the fluorosilicate (FSG) layer has a higher moisture content than the remaining etched fluorosilicate glass (FSG) layer.

Although the preferred embodiment of the present invention illustrates the present invention within the context of forming a fluorosilicate glass (FSG) layer incident to employing a chemical mechanical polish (CMP) planarizing method which provides the fluorosilicate glass (FSG) layer with a hydrated surface layer of the fluorosilicate glass (FSG) layer which has a higher moisture content than a non-hydrated remainder layer of the fluorosilicate glass (FSG) layer, the method of the present invention may be employed for forming fluorosilicate glass (FSG) layers with enhanced stability when surface layers of the fluorosilicate glass layers entrain a higher level of moisture than remainder layers of the fluorosilicate glass (FSG) layers incident to microelectronic fabrication processing other than chemical mechanical polish (CMP) planarizing processing. Such other microelectronics fabrication processing may include, but is not limited to microelectronics fabrication processing which provides for adventitious ambient environmental moisture absorption which provides a hydrated surface layer of a fluorosilicate glass (FSG) layer having a higher moisture content than an underlying non-hydrated remainder layer of the fluorosilicate glass (FSG) layer.

Figure 1:
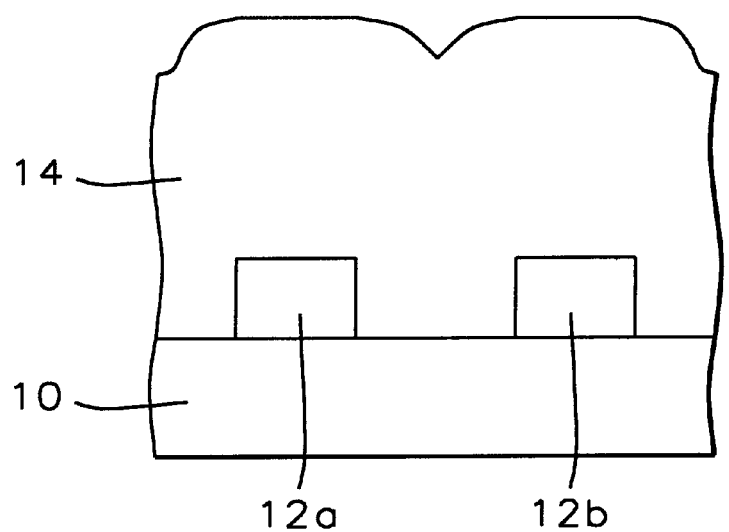
FIG. 1, FIG. 2, FIG. 3 and FIG. 4 show a series of schematic cross-sectional diagrams illustrating the results of forming, in accord with a preferred embodiment of the present invention, a fluorosilicate glass (FSG) layer within a microelectronic fabrication.

Referring now to FIG. 1 to FIG. 4, there is show a series of schematic cross-sectional diagrams illustrating the results of progressive stages in forming within a microelectronic fabrication a fluorosilicate glass (FSG) layer in accord with a preferred embodiment of the present invention. Shown in FIG. 1 is a schematic cross-sectional diagram of the microelectronic fabrication at an early stage in its fabrication.

Shown in FIG. 1 is a substrate 10 having formed thereupon a pair of patterned layers 12a and 12b. In turn, the pair of patterned layers 12a and 12b has formed thereupon a blanket fluorosilicate glass (FSG) layer 14.

Within the preferred embodiment of the present invention with respect to the substrate 10, the substrate 10 may be employed within a microelectronic fabrication selected from the group including but not limited to semiconductor integrated circuit microelectronic fabrications, ceramic substrate microelectronic fabrications, solar cell microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may be the substrate itself employed within the microelectronic fabrication, or in the alternative, the substrate 10 may be the substrate as employed within the microelectronic fabrication, where the substrate has formed thereupon or thereover, and thus incorporated therein, any of several additional microelectronic layers as are commonly employed within the microelectronic fabrication within which is employed the substrate. Such additional microelectronic layers may include, but are not limited to microelectronic conductor layers, microelectronic semiconductor layers and microelectronic dielectric layers.

Within the preferred embodiment of the present invention with respect to the pair of patterned layers 12a and 12b, the pair of patterned layers 12a and 12b may, similarly with additional layers which are formed upon or over and thus incorporated into the substrate 10, also be formed of materials including but not limited to microelectronic conductor materials, microelectronic semiconductor materials and microelectronic dielectric materials. Typically and preferably, the pair of patterned layers 12a and 12b will be patterned microelectronics conductor layers or patterned microelectronic semiconductor layers formed to a thickness of from about 3500 to about 6000 angstroms and a linewidth of from about 0.2 to about 1.0 microns. More typically and preferably, within the preferred embodiment of the present invention, the substrate 10 is a semiconductor substrate employed within a semiconductor integrated circuit microelectronic fabrication, where the semiconductor substrate has formed therein and/or thereupon semiconductor devices, and where the semiconductor substrate has formed thereover and over the semiconductor devices and incorporated as a top layer a microelectronic dielectric layer. Similarly, more typically and preferably, the pair of patterned layers 12a and 12b are under such circumstances patterned microelectronics conductor layers which are employed to connect and/or interconnect semiconductor integrated circuit devices which are formed within and/or upon the semiconductor substrate within the semiconductor integrated circuit microelectronics fabrication.

Within the preferred embodiment of the present invention with respect to the blanket fluorosilicate glass (FSG) layer 14, the blanket fluorosilicate glass (FSG) layer may be formed employing methods and materials as are conventional in the art of microelectronic fabrication, such methods being found, for example and without limitation, within the Description of the Related Art, in particular within Guo et al, the teachings of which are incorporated herein fully by reference. More preferably, within the preferred embodiment of the present invention, the blanket fluorosilicate glass (FSG) layer 14 is formed employing a high density plasma chemical vapor deposition (HDPCVD) method in order to provide optimal gap filling characteristics for the blanket fluorosilicate glass (FSG) layer within the aperture defined by the pair of patterned layers 12a and 12b. Preferably, the high density plasma chemical vapor deposition (HDPCVD) method employs silane as a silicon source material, oxygen as an oxygen source material, silicon tetrafluoride as a fluorine source material and argon as a sputtering source material.

Preferably, the high density plasma chemical vapor deposition (HDPCVD) method also employs, when forming the blanket fluorosilicate glass (FSG) layer 14 upon an eight inch diameter substrate: (1) a reactor chamber pressure of from about 1 to about 5 mtorr; (2) a source radio frequency power of from about 3500 to about 4500 watts at a source radio frequency of 350 MHZ; (3) a bias power of from about 3500 to about 4500 watts; (4) a substrate 10 temperature of from about 350 to about 400 degrees centigrade; (5) a silane flow rate of from about 40 to about 60 standard cubic centimeters per minute (sccm); (6) an oxygen flow rate of from about 80 to about 120 standard cubic centimeters per minute (sccm); (7) an argon flow rate of from about 40 to about 60 standard cubic centimeters per minute (sccm); and (7) a silicon tetrafluoride flow rate of from about 40 to about 50 standard cubic centimeters per minute (sccm). Preferably, the blanket fluorosilicate glass (FSG) layer 14 is formed to a thickness of from about 17000 to about 20000 angstroms.

Figure 2:
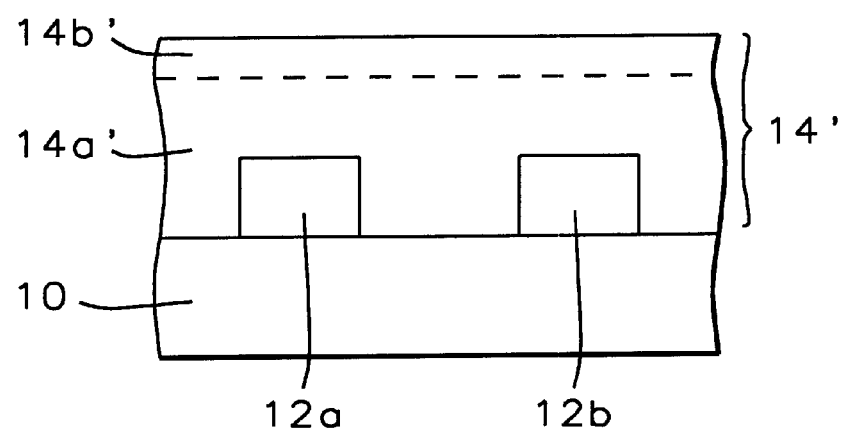

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein the blanket fluorosilicate glass (FSG) layer 14 has been planarized, while employing a chemical mechanical polish (CMP) planarizing method, to form a chemical mechanical polish (CMP) planarized blanket fluorosilicate glass (FSG) layer 14'. As is illustrated within the schematic cross-sectional diagram of FIG. 2, and incident to forming the chemical mechanical polish (CMP) planarized blanket fluorosilicate glass (FSG) layer 14' from the blanket fluorosilicate glass (FSG) layer 14, the chemical mechanical polish (CMP) planarized blanket fluorosilicate glass (FSG) layer 14' is formed with a hydrated surface layer 14b' of the chemical mechanical polish (CMP) planarized blanket fluorosilicate glass (FSG) layer 14' and a non-hydrated remainder layer 14a' of the chemical mechanical polish (CMP) planarized blanket fluorosilicate glass (FSG) layer 14'.

Within the preferred embodiment of the present invention, the hydrated surface layer 14b' of the chemical mechanical polish (CMP) planarized blanket fluorosilicate glass (FSG) layer 14' is typically characterized by a thickness of from about 5000 to about 7000 angstroms. It is believed that an elevated moisture content within a fluorosilicate glass (FSG) layer within a microelectronic fabrication is detrimental insofar as such an elevated moisture content is believed to provide for hydrolysis of fluorosilicate glass (FSG) layers which in turn is believed to provide within fluorosilicate glass (FSG) layers materials, such as but not limited to hydrofluoric acid derivative materials, which might be corrosive to patterned conductor layers within microelectronics fabrications within which are formed fluorosilicate glass (FSG) layers.

Figure 3:
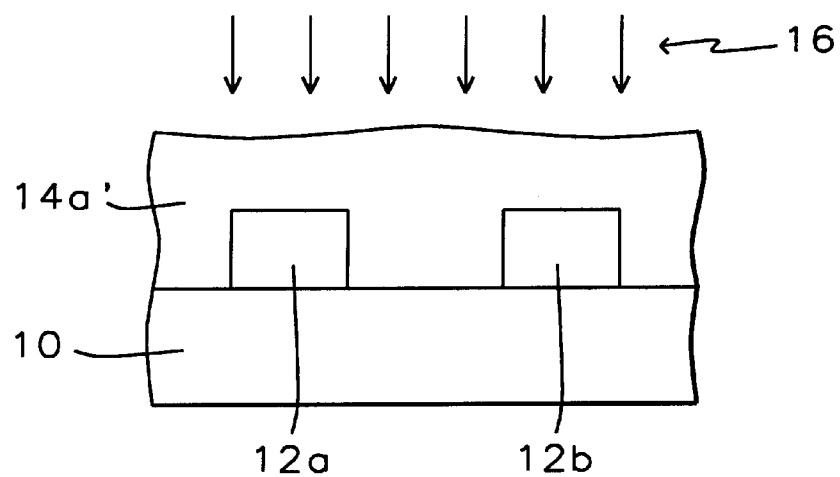

Referring now to FIG. 3, there is shown a schematic cross-sectional diagram illustrating the results of further processing of the microelectronic fabrication whose schematic cross-sectional diagram is illustrated in FIG. 2. Shown in FIG. 3 is a schematic cross-sectional diagram of a microelectronic fabrication otherwise equivalent to the microelectronics fabrication whose schematic cross-sectional diagram is illustrated in FIG. 2, but wherein there has been removed from the microelectronic fabrication the hydrated surface layer 14b' of the chemical mechanical polish (CMP) planarized blanket fluorosilicate glass (FSG) layer 14' while employing an etching plasma 16. Although the etching plasma 16 may employ any of several physical etching and chemical etching components, in order to limit plasma induced damage to the substrate and/or microelectronics devices formed within or upon the substrate 10, the etching plasma 16 is preferably a reactive ion etch (RIE) plasma which employs a predominant chemical etching of the hydrated surface layer 14b' of the chemical mechanical polish (CMP) planarized blanket fluorosilicate glass (FSG) layer 14'. Such reactive ion etch (RIE) plasmas will typically and preferably employ an etchant gas composition which upon plasma activation provides an active fluorine containing etchant species. Such etchant gas compositions may comprise, but are not limited to fluorine containing gases, such as flurorcarbons, including but not limited to carbon tetrafluoride and hexafluoroethane, as well as sulfur hexafluoride and nitrogen trifluoride. Of the foregoing fluorine containing gases, carbon tetrafluoride and nitrogen trifluoride are in particular recognized as providing minimal residue upon etching fluorosilicate glass (FSG) materials and are thus particularly desirable within the etching plasma 16 within the preferred embodiment of the present invention.

Preferably, the etching plasma 16 also employs, when etching the hydrated surface layer 14b' of the chemical mechanical polish (CMP) planarized blanket fluorosilicate glass (FSG) layer 14' upon an eight inch diameter substrate: (1) a reactor chamber pressure of from about 1 to about 3 torr; (2) a source radio frequency power of from about 2000 to about 3000 watts at a source radio frequency of 350 MHZ; (3) a bias power of from about 1000 to about 2000 watts; (4) a substrate 10 temperature of from about 150 to about 300 degrees centigrade; (5) a nitrogen trifluoride at a flow rate of from about 1000 to about 1500 standard cubic centimeters per minute (sccm).

Figure 4:
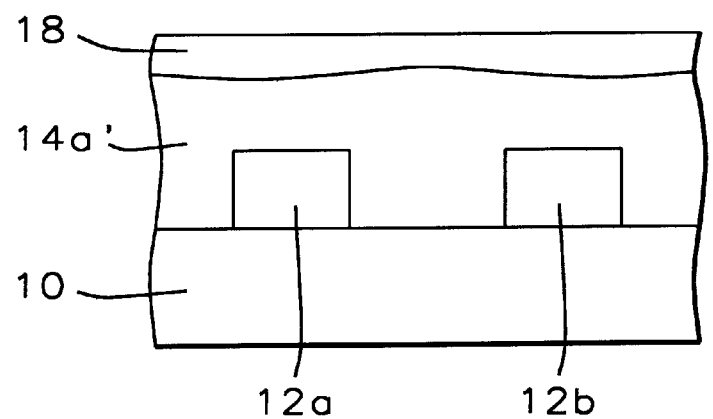

Referring now to FIG. 4, there is shown a schematic cross-sectional diagram of a microelectronic fabrication illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein there is formed upon the non-hydrated remainder layer 14a' of the chemical mechanical polish (CMP) planarized blanket fluorosilicate glass (FSG) layer 14' a blanket cap dielectric layer 18. Within the preferred embodiment of the present invention, the blanket cap dielectric layer 18 is preferably formed of a dense dielectric material which provides a moisture barrier to the non-hydrated remainder layer 14a' of the chemical mechanical polish (CMP) planarized blanket fluorosilicate glass (FSG) layer 14'. In that regard, the blanket cap dielectric layer 18 is preferably formed employing a high density plasma chemical vapor deposition (HDPCVD) method which provides a blanket cap dielectric layer 18 formed of a dielectric material selected from the group consisting of silicon oxide dielectric materials, silicon nitride dielectric materials and silicon oxynitride dielectric materials. More preferably, the blanket cap dielectric layer 18 is formed of a silicon oxide dielectric material formed while employing the high density plasma chemical vapor deposition (FIDPCVD) method along with silane as a silicon source material, oxygen as an oxygen source material and argon as a sputtering source material.

Preferably, the high density plasma chemical vapor deposition (HDPCVD) method also employs when forming the blanket dielectric cap layer 18 of a silicon oxide dielectric material upon an eight inch diameter substrate: (1) a reactor chamber pressure of from about 1 to about 5 mtorr; (2) a source radio frequency source power of from about 3500 to about 4500 watts at a source radio frequency of 350 MHZ; (3) a bias power of from about 2500 to about 3500 watts; (4) a silane flow rate of from about 100 to about 150 standard cubic centimeters per minute (sccm); (5) an oxygen flow rate of from about 20 to about 50 standard cubic centimeters per minute (sccm); and (6) an argon flow rate of from about 100 to about 150 standard cubic centimeters per minute (sccm). Preferably, the blanket cap dielectric layer 18 is formed to a thickness of from about 1500 to about 2500 angstroms.

Although not specifically illustrated within the schematic cross-sectional diagram of FIG. 4, there may typically and preferably be employed when forming the blanket cap dielectric layer 18 the same high density plasma chemical vapor deposition (HDPCVD) reactor chamber which may be employed for removing from the microelectronics fabrication whose schematic cross-sectional diagram is illustrated in FIG. 2 the hydrated surface layer 14b' of the chemical mechanical polish (CMP) planarized blanket fluorosilicate glass (FSG) layer 14' to form the microelectronics fabrication whose schematic cross-sectional diagram is illustrated in FIG. 3. Similarly, the same high density plasma chemical vapor deposition (HDPCVD) reactor chamber may also be employed for forming the blanket fluorosilicate glass (FSG) layer 14.

As an alternative, it is also feasible and typically economical within the present invention to employ a plasma enhanced chemical vapor deposition (PECVD) reactor chamber other than a high density plasma chemical vapor deposition (HDPCVD) reactor chamber to both: (1) etch the hydrated surface layer 14b' of the chemical mechanical polish (CMP) planarized blanket fluorosilicate glass (FSG) layer 14' from the chemical mechanical polish (CMP) planarized blanket fluorosilicate glass (FSG) layer 14' while employing a plasma etch method; and (2) form upon the remaining non-hydrated remainder layer 14a' of the chemical mechanical polish (CMP) planarized blanket fluorosilicate glass (FSG) layer 14' the blanket cap dielectric layer 18 while employing a plasma enhanced chemical vapor deposition (PECVD) method. Under such circumstances, there will typically and preferably be employed: (1) an etchant gas composition comprising carbon tetrafluoride and nitrous oxide for etching the hydrated surface layer 14b' of the chemical mechanical polish (CMP) planarized blanket fluorosilicate glass (FSG) layer 14' from the chemical mechanical polish (CMP) planarized blanket fluorosilicate glass (FSG) layer 14' while employing the plasma etch method;

and (2) a deposition gas composition comprising silane and nitrous oxide for forming upon the non-hydrated remainder layer 14*a*' of the chemical mechanical polish planarized fluorosilicate glass (FSG) layer 14' the blanket cap dielectric layer 18 while employing the plasma enhanced chemical vapor deposition (PECVD) method.

The foregoing plasma etch method when employed within the plasma enhanced chemical vapor deposition (PECVD) reactor chamber will typically and preferably also employ: (1) a reactor chamber pressure of from about 5 to about 6 torr; (2) a radio frequency source power of from about 800 to about 1200 watts at a source radio frequency of 13.56 MHZ; (3) a bias power of from about 200 to about 300 watts; (4) a substrate 10 temperature of from about 350 to about 450 degrees centigrade; (5) a carbon tetrafluoride flow rate of from about 1300 to about 1800 standard cubic centimeters per minute (sccm); and (6) a nitrous oxide flow rate of from about 400 to about 500 standard cubic centimeters per minute (sccm).

The foregoing plasma enhanced chemical vapor deposition (PECVD) method when employed within the plasma enhanced chemical vapor deposition (PECVD) reactor chamber will typically and preferably also employ: (1) a reactor chamber pressure of about 2 to about 3 torr; (2) a radio frequency source power of from about 150 to about 250 watts at a source radio frequency of 13.56 MHZ; (3) a bias power of from about 200 to about 300 watts; (4) a substrate temperature of from about 350 to about 450 degrees centigrade; (5) a silane flow rate of from about 65 to about 95 standard cubic centimeters per minute (sccm); and (6) a nitrous oxide flow rate of from about 1600 to about 2000 standard cubic centimeters per minute (sccm).

As an additional alternative, it is also feasible and economical within the present invention to employ a conventional plasma etch reactor chamber (which does not simultaneously serve as a plasma enhanced chemical vapor deposition (PECVD) reactor chamber) to strip the hydrated surface layer 14*b*' of the chemical mechanical polish (CMP) planarized blanket fluorosilicate glass (FSG) layer 14' and to then employ either the foregoing high density plasma chemical vapor deposition (HDPCVD) reactor chamber or a plasma enhanced chemical vapor deposition (PECVD) reactor chamber for forming the blanket cap dielectric layer 18 in accord with the foregoing deposition conditions. Under such circumstances there is typically and preferably employed within an attendant plasma etch method within the plasma etch reactor chamber an etchant gas composition comprising carbon tetrafluoride, trifluoromethane, argon and nitrogen. Similarly, under such circumstances, the conventional plasma etch reactor chamber may be integrated, within the context of a "cluster tool" having multiple interconnected chambers at reduced pressure, with either or both of the foregoing high density plasma chemical vapor deposition (HDPCVD) reactor chamber or the plasma enhanced chemical vapor deposition (PECVD) reactor chamber for forming the blanket cap dielectric layer 18.

Preferably, the attendant plasma etch method also employs: (1) a reactor chamber pressure of from about 200 to about 250 mtorr; (2) a radio frequency source power of from about 800 to about 1200 watts at a source radio frequency of 13.56 MHZ; (3) a carbon tetrafluoride flow rate of from about 10 to about 20 standard cubic centimeters per minute (sccm); (4) a trifluoromethane flow rate of from about 35 to about 55 standard cubic centimeters per minute (sccm); (5) an argon flow rate of from about 100 to about 140 standard cubic centimeters per minute (sccm); and (6) a nitrogen flow rate of from about 8 to about 12 standard cubic centimeters per minute (sccm).

Upon forming the microelectronics fabrication whose schematic cross-sectional diagram is illustrated within either FIG. 3 or FIG. 4, there is formed a microelectronics fabrication having formed therein a fluorosilicate glass (FSG) layer with enhanced stability with respect to loosely bound mobile fluorine atoms within the fluorosilicate glass (FSG) layer. The fluorosilicate glass (FSG) layer has enhanced stability since there is removed from the fluorosilicate glass (FSG) layer a hydrated surface layer of the fluorosilicate glass (FSG) layer which would otherwise provide moisture which could react with the loosely bound mobile fluorine atoms and compromise operation of the microelectronics fabrication within which is formed the fluorosilicate glass (FSG) layer.

As is understood by a person skilled in the art, the preferred embodiment of the present invention is illustrative of the present invention rather than limiting of the present invention. Revisions and modifications may be made to methods, materials, structures and dimensions through which is provided the preferred embodiment of the present invention while still providing embodiments of the present invention which are within the spirit and scope of the present invention, as defined by the appended claims.

What is claimed is:

1. A method for forming a fluorosilicate glass (FSG) layer comprising:

providing a substrate;

forming over the substrate a fluorosilicate glass (FSG) layer; and removing, while employing a plasma etch method, a surface layer of the fluorosilicate glass (FSG) layer to form an etched fluorosilicate glass (FSG) layer; wherein the surface layer of the fluorosilicate glass (FSG) layer has a higher moisture content than the etched fluorosilicate glass (FSG) layer.

2. The method of claim 1 wherein the substrate is employed within a microelectronics fabrication selected from the group consisting of semiconductor integrated circuit microelectronic fabrications, ceramic substrate microelectronics fabrications, solar cell microelectronic fabrications, sensor image array optoelectronic microelectronic fabrications and display image array optoelectronic microelectronic fabrications.

3. The method of claim 1 wherein the plasma etch method is a reactive ion etch (RIE) plasma etch method employing an etchant gas composition which upon plasma activation forms an active fluorine containing etchant species.

4. The method of claim 3 wherein the etchant gas composition comprises an etchant gas selected from the group consisting of carbon tetrafluoride, hexafluoroethane, sulfur hexafluoride and nitrogen trifluoride.

5. The method of claim 1 further comprising forming upon the etched fluorosilicate glass (FSG) layer a cap dielectric layer.

6. The method of claim 1 further comprising forming over the substrate a patterned conductor layer prior to forming over the substrate the fluorosilicate glass (FSG) layer, where the fluorosilicate glass (FSG) layer is formed upon and interposed between the patterns of the patterned conductor layer.

7. The method of claim 3 wherein the substrate is employed within a microelectronics fabrication selected from the group consisting of semiconductor integrated circuit microelectronic fabrications, ceramic substrate microelectronic fabrications, solar cell microelectronic fabrications, sensor image array optoelectronic microelectronic fabrications and display image array optoelectronic microelectronic fabrications.

8. The method of claim 3 further comprising forming upon the etched fluorosilicate glass (FSG) layer a cap dielectric layer.

9. The method of claim 3 further comprising forming over the substrate a patterned conductor layer prior to forming over the substrate the fluorosilicate glass (FSG) layer, where the fluorosilicate glass (FSG) layer is formed upon and interposed between the patterns of the patterned conductor layer.

10. A method for forming a fluorosilicate glass (FSG) layer comprising:

providing a substrate;

forming over the substrate a fluorosilicate glass (FSG) layer;

chemical mechanical polish (CMP) planarizing the fluorosilicate glass (FSG) layer to form a chemical mechanical polish (CMP) planarized fluorosilicate glass (FSG) layer having a hydrated surface layer of the chemical mechanical polish (CMP) planarized fluorosilicate glass (FSG) layer and a non-hydrated underlying remainder layer of the chemical mechanical polish (CMP) planarized fluorosilicate glass (FSG) layer; and removing, while employing a plasma etch method, the hydrated surface layer of the chemical mechanical polish (CMP) planarized fluorosilicate glass (FSG) layer to leave remaining the non-hydrated underlying remainder layer of the chemical mechanical polish (CMP) planarized fluorosilicate glass (FSG) layer.

11. The method of claim 10 wherein the substrate is employed within a microelectronics fabrication selected from the group consisting of semiconductor integrated circuit microelectronic fabrications, ceramic substrate microelectronics fabrications, solar cell microelectronic fabrications, sensor image array optoelectronic microelectronic fabrications and display image array optoelectronic microelectronic fabrications.

12. The method of claim 10 wherein the plasma etch method is a reactive ion etch (RIE) plasma etch method employing an etchant gas composition which upon plasma activation forms an active fluorine containing etchant species.

13. The method of claim 12 wherein the etchant gas composition comprises an etchant gas selected from the group consisting of carbon tetrafluoride, hexafluoroethane, sulfur hexafluoride and nitrogen trifluoride.

14. The method of claim 10 further comprising forming upon the non-hydrated underlying remainder layer of the chemical mechanical polish (CMP) planarized fluorosilicate glass (FSG) layer a cap dielectric layer.

15. The method of claim 10 further comprising formed over the substrate a patterned conductor layer prior to forming over the substrate the fluorosilicate glass (FSG) layer, where the fluorosilicate glass (FSG) layer is formed upon and interposed between the patterns of the patterned conductor layer.

* * * * *